(12) United States Patent
Kim et al.

(10) Patent No.: US 7,995,977 B2
(45) Date of Patent: Aug. 9, 2011

(54) HIGH FREQUENCY POWER DETECTOR CIRCUIT AND RADIO COMMUNICATION DEVICE

(75) Inventors: Ryangsu Kim, Osaka (JP); Hiroshi Kimura, Hyogo (JP)

(73) Assignee: Panasonic Corporation, Osaka (JP)

( * ) Notice: Subject to any disclaimer, the term of this patent is extended or adjusted under 35 U.S.C. 154(b) by 520 days.

(21) Appl. No.: 12/247,658

(22) Filed: Oct. 8, 2008

(65) Prior Publication Data

US 2009/0108832 A1    Apr. 30, 2009

(30) Foreign Application Priority Data

Oct. 24, 2007   (JP) .................................. 2007-276417

(51) Int. Cl.
   *H04B 1/04*   (2006.01)
(52) U.S. Cl. ................ 455/127.2; 455/250.1; 455/550.1; 327/543
(58) Field of Classification Search ............... 455/127.1, 455/127.2, 127.5, 230, 232.1, 234.1, 250.1, 455/550.1; 327/538, 540, 543
See application file for complete search history.

(56) References Cited

U.S. PATENT DOCUMENTS

| 4,241,455 | A | 12/1980 | Eibner |
| 4,297,645 | A | 10/1981 | Tanaka et al. |
| 5,987,312 | A | 11/1999 | Dekker |
| 6,459,325 | B1 * | 10/2002 | Hall et al. ...................... 327/391 |
| 6,859,645 | B2 * | 2/2005 | Yu ................................. 455/222 |
| 7,042,275 | B2 * | 5/2006 | Suwa et al. .................... 327/536 |
| 7,249,271 | B2 * | 7/2007 | Shibata et al. ................. 713/324 |
| 7,456,680 | B2 * | 11/2008 | Gyohten et al. ............. 327/541 |
| 7,689,181 | B2 * | 3/2010 | Asam ......................... 455/127.1 |
| 2004/0198262 | A1 | 10/2004 | Ehrenreich et al. |

FOREIGN PATENT DOCUMENTS

JP          2006-505197           2/2006

OTHER PUBLICATIONS

Wong, Stephen L. et al., "A 2.7-5.5 V, 0.2-1 W BiCMOS RF Driver Amplifier IC with Closed-Loop Power Control and Biasing Functions," IEEE Journal of Solid State Circuits, vol. 33, No. 12, Dec. 1998, pp. 2259-2264.

* cited by examiner

*Primary Examiner* — Nhan Le
(74) *Attorney, Agent, or Firm* — McDermott Will & Emery LLP

(57) ABSTRACT

First and second envelope detector circuits have, respectively, a resistance row, a capacitative element connected to the resistance row in parallel and a transistor connected between a connection point between the resistance row and the capacitative element and a predetermined voltage node. An output of a level shifter is supplied to a gate or a base of the transistor of the first envelope detector circuit. A predetermined voltage is supplied to a gate or a base of the transistor of the second envelope detector circuit. A detector detects an intermediate terminal voltage of the resistance row of the first envelope detector circuit with reference to a total voltage or an intermediate terminal voltage of the resistance row of the second envelope detector circuit.

12 Claims, 4 Drawing Sheets

HIGH FREQUENCY POWER DETECTOR CIRCUIT AND RADIO COMMUNICATION DEVICE

CROSS-REFERENCE TO RELATED APPLICATION

This non-provisional application claims priority under 35 U.S.C. §119(a) of Japanese Patent Application No. 2007-276417 filed in Japan on Oct. 24, 2007, the entire contents of which are hereby incorporated by reference.

BACKGROUND OF THE INVENTION

1. Field of the Invention

The present invention relates to a detector circuit for detecting high frequency signal power. In particular, it relates to a high frequency power detector circuit useful for automatic gain control and automatic power level control in radio communication devices.

2. Description of Related Art

In recent years, cellular phone terminals have been provided with various radio communication functions such as digital television, FM radio, Bluetooth® and wireless LAN in addition to a telephone function. In order to meet increasing demand for reduction in size and cost of radio communication terminals and modules included in them, integration of high performance circuit systems, which have not been integrated so far, has been proceeding on a radio communication chip. A high frequency signal power detector circuit (a high frequency power detector circuit) is an example of the high performance circuit systems.

In radio communication devices, a high frequency power detector circuit is used for automatic gain control in an amplifier and a mixer on a receiving system based on the intensity of a received signal input from an antenna, and for automatic gain control in a power amplifier on a transmission system by detecting an output signal level of the power amplifier. Such automatic control systems are incorporated in most of radio communication transmitters/receivers to achieve highly reliable radio communication.

In general, automatic gain control is performed based on the results of comparison between a reference signal generated in an integrated circuit (IC) and an output signal of an envelope detector circuit. Therefore, the precision of the control system depends on the precision of the internally generated reference signal and the output signal of the envelope detector circuit. For this reason, if reduction in supply voltage and increase in variation in the course of manufacture associated with the shrink of semiconductor design rules take place, signals received at an IC of a radio communication transmitter/receiver are distorted and a significant amount of noise is contained in the signal. As a result, radio communication quality is impaired.

The rapidly spreading digital terrestrial television broadcasting for mobile units (ISDB-T, so-called one segment broadcasting) is characterized in that a broadband radio communication band is used. In many cases, cellular phones are equipped with an IC for receiving the one segment broadcasting. Therefore, even if a high frequency filter is provided between the antenna and a tuner intended for the one segment broadcasting, various kinds of interference waves in and out of the band are input into the tuner through the antenna or by inner radiation. For improved communication quality, it is necessary to dynamically switch the power detection level based on a received channel or a radio wave condition. This brings about a need of realizing an inexpensive high frequency power detector circuit having higher precision as compared with conventional ones, while a semiconductor process under finer design rules is employed, though which results in significant variations in the course of manufacture. Further, in view of reduced product life cycle, an easy-to-design detector circuit which eliminates the need of adjustment of variations in the course of manufacture before shipment as much as possible has been demanded.

In many cases, an envelope detector circuit mainly consisting of a transistor, a current source and a capacitance is used in a conventional high frequency power detector circuit (cf. Nonpatent Literature 1). Further, for reduction of detection error, a high frequency power detector circuit in which a DC reference voltage is converted to an AC (square wave) reference voltage has been proposed (cf. Patent Literature 1).

FIG. 5 shows the structure of a conventional high frequency power detector circuit. An input high frequency signal is input to a base of a transistor 21 of an envelope detector circuit 2 after the center level of the input high frequency signal is shifted by a level shifter 1. In the envelope detector circuit 2, a collector of the transistor 21 is connected to a supply voltage node. A current source 22 and a capacitive element 23 are connected in parallel between an emitter and a ground node. When a capacitance value of the capacitive element 23 is increased to a sufficient degree, an envelope of the high frequency signal input to the base of the transistor 21 is extracted from the emitter.

In the same manner as the envelope detector circuit 2, an envelope detector circuit 3 includes a transistor 31 and a current source 32 and a capacitive element 33 connected in parallel to an emitter of the transistor 31. A reference voltage generated in a reference voltage generating circuit 4 is applied to a base of the transistor 31 and a reference signal is output from the emitter. A low-pass filter 5 outputs the results of high frequency signal power detection based on a difference between the outputs from the envelope detector circuits 2 and 3. The reference voltage generating circuit 4 is configured to generate a reference voltage corresponding to a power to be detected by changing a DC reference voltage Vref so that multiple levels of power are detected. In this way, a high frequency power detector circuit is constructed by the envelope detector circuit 2 and its replica (envelope detector circuit 3) with the aim of reducing variations in detected output due to temperature, supply voltage and variations in threshold value of the transistor in the course of manufacture.

Patent Literature 1: Publication of US Patent Application No. 2004/0198262 A1

Nonpatent Literature 1: Stephen L. Wong and Sifen Luo, "A 2.7-5.5 V, 0.2-1 W BiCMOS RF Driver Amplifier IC with Closed-Loop Power Control and Biasing Functions", IEEE JOURNAL OF SOLID STATE CIRCUITS, VOL. 33, NO. 12, DECEMBER 1998, pp. 2259-2264

SUMMARY OF THE INVENTION

According to a conventional high frequency power detector circuit, a current source and a resistance row are essential to generate the reference voltage. Therefore, an absolute resistance value varies due to variations in the course of manufacture, change in temperature and change in supply voltage, thereby causing an error in detected power level. In general, current mirror circuits are used as current sources in an envelope detector circuit and its replica. However, an error in detected power level may occur due to an error in input reference current and a mismatch between threshold values of paired transistors in the current mirror circuit. Further, since the conventional high frequency power detector circuit requires a reference voltage generating circuit in addition to the two envelope detector circuits, the circuit dimension is increased.

With the foregoing in mind, an object of the present invention is to provide a high frequency power detector circuit which reduces the detection error caused by variations in the course of manufacture, change in temperature and change in supply voltage and reduces the area of the circuit, and a radio communication device including the circuit.

As a measure taken to achieve the object, the present invention provides a high frequency power detector circuit for detecting a power level of an input high frequency signal including: first and second envelope detector circuits each having a resistance row, a capacitative element connected to the resistance row in parallel and a transistor connected between a connection point between the resistance row and the capacitative element and a predetermined voltage node; a level shifter for shifting a center level of the high frequency signal to a predetermined voltage; and a detector for detecting an intermediate terminal voltage of the resistance row of the first envelope detector circuit with reference to a total voltage or an intermediate terminal voltage of the resistance row of the second envelope detector circuit. An output of the level shifter is supplied to a gate or a base of the transistor of the first envelope detector circuit and the predetermined voltage is supplied to a gate or a base of the transistor of the second envelope detector circuit.

According to the configuration, an envelope of the high frequency signal is detected by the first envelope detector circuit, a reference voltage for power level detection is generated by the second envelope detector circuit of the same structure as the first envelope detector circuit and an output of the first envelope detector circuit is detected by the detector with reference to an output of the second envelope detector circuit. As a result, the power level of the input high frequency signal is detected. The first and second envelope detector circuits may be provided without using a current source. Further, there is no need of additionally providing a reference voltage generating circuit. Accordingly, the total number of resistance elements is kept small. Therefore, as compared with conventional ones, the high frequency power detector circuit is improved in resistance against variations in the course of manufacture, change in temperature and change in supply voltage, thereby raising precision of high frequency power detection, and is reduced in size.

The high frequency power detector circuit may further include a selector for selecting any one of the total voltage and one or more intermediate terminal voltages of the resistance row of the second envelope detector circuit as an input to the detector. With this configuration, a preferable reference voltage is selected based on variations in the course of manufacture, change in temperature and change in supply voltage. This high frequency power detector circuit may further include a controller for controlling the operation of the selector.

The high frequency power detector circuit may further include a second detector for detecting the intermediate terminal voltage input from the first envelope detector circuit to the detector with reference to an intermediate terminal voltage of the resistance row of the second envelope detector circuit, the intermediate terminal voltage being different from the intermediate terminal voltage input to the detector. With this configuration, an upper limit and a lower limit of the voltage level of the input high frequency signal are detected.

The high frequency power detector circuit may further include a selector for selecting any one of multiple intermediate terminal voltages of the resistance row of the second envelope detector circuit as an input to the second detector. With this configuration, a preferable reference voltage is selected based on variations in the course of manufacture, change in temperature and change in supply voltage. This high frequency power detector circuit may further include a controller for controlling the operation of the selector.

DETAILED DESCRIPTION OF THE INVENTION

Hereinafter, best modes for carrying out the present invention are described with reference to the drawings.

Embodiment 1

Figure 1:
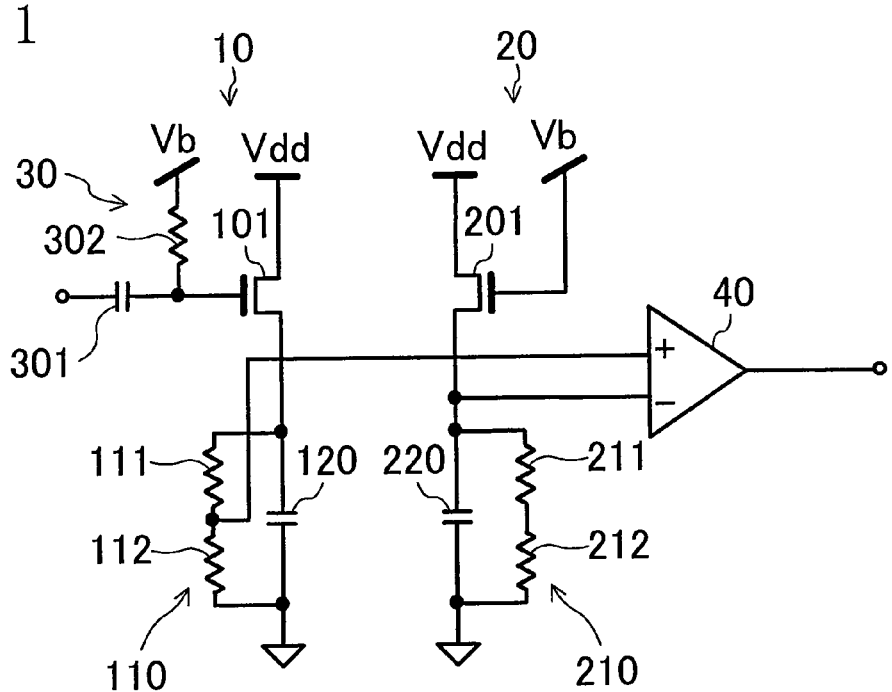
FIG. 1 shows the structure of a high frequency power detector circuit according to Embodiment 1 of the present invention.

FIG. 1 shows the structure of a high frequency power detector circuit according to Embodiment 1. The high frequency power detector circuit of the present embodiment includes two envelope detector circuits 10 and 20, a level shifter 30 and a detector 40. In the envelope detector circuit 10, a drain of an N-channel field effect transistor 101 is connected to a supply voltage Vdd and a resistance row 110 including two serially-connected resistance elements 111 and 112 and a capacitative element 120 are connected to a source the transistor 101 in parallel. The structure of another envelope detector circuit 20 is the same as that of the envelope detector circuit 10. That is, in the envelope detector circuit 20, a drain of an N-channel field effect transistor 201 is connected to a supply voltage Vdd and a resistance row 210 including two serially-connected resistance elements 211 and 212 and a capacitative element 220 are connected to a source of the transistor 201 in parallel. In the envelope detector circuits 10 and 20, corresponding elements have the same characteristic value. For example, the capacitative elements 120 and 220 have the same capacitance.

The level shifter 30 is configured to shift a center level of an input high frequency signal to a predetermined voltage. More specifically, the level shifter 30 cuts a DC component of the high frequency signal at a capacitative element 301 and applies, in place of it, a bias voltage Vb through a resistance element 302. The bias voltage Vb is a DC reference voltage which determines an absolute value of a power level. Therefore, it is preferred that the bias voltage Vb is less likely to vary due to variations in the course of manufacture, change in temperature and change in supply voltage.

An output of the level shifter 30 is input to a gate of the transistor 101 of the envelope detector circuit 10. The transistor 101 rectifies a signal input to the gate so that the capacitative element 120 is charged. According to this action, a source voltage of the transistor 101 becomes a value corresponding to an amplitude of the high frequency signal. When a time constant determined by the product of a total resistance of the resistance row 110 and a capacitance of the capacitative element 120 is sufficiently greater than a single period of the input high frequency signal, the source voltage of the transistor 101 becomes a value corresponding to an envelope of the high frequency signal.

To a gate of the transistor 201 of the envelope detector circuit 20, a bias voltage Vb corresponding to the center level of the high frequency signal is applied. Since the envelope detector circuit 20 is a replica of the envelope detector circuit 10, a source voltage of the transistor 201 corresponds to the source voltage of the transistor 101 when the high frequency signal is not input. Therefore, using the source voltage of the transistor 201 as a reference voltage, the reference voltage and a detection signal of the envelope detector circuit 10 are compared, so that a power level of the input high frequency signal is detected. The capacitative element 220 serves to eliminate noise contained in the supply voltage Vdd.

When the high frequency signal is input, however, the source voltage of the transistor 101 is inevitably higher than the source voltage of the transistor 201. Therefore, the power level of the high frequency signal cannot be detected by simply comparing the source voltages. In view of this, an intermediate terminal voltage of the resistance row 110 in the envelope detector circuit 10, i.e., a voltage at a connection point between the resistance elements 111 and 112, is considered as an output of the envelope detector circuit 10. The intermediate terminal voltage of the resistance row 110 is made smaller than the source voltage of the transistor 201 by setting the resistance ratio between the resistance elements 111 and 112 to a suitable value.

Figure 5:
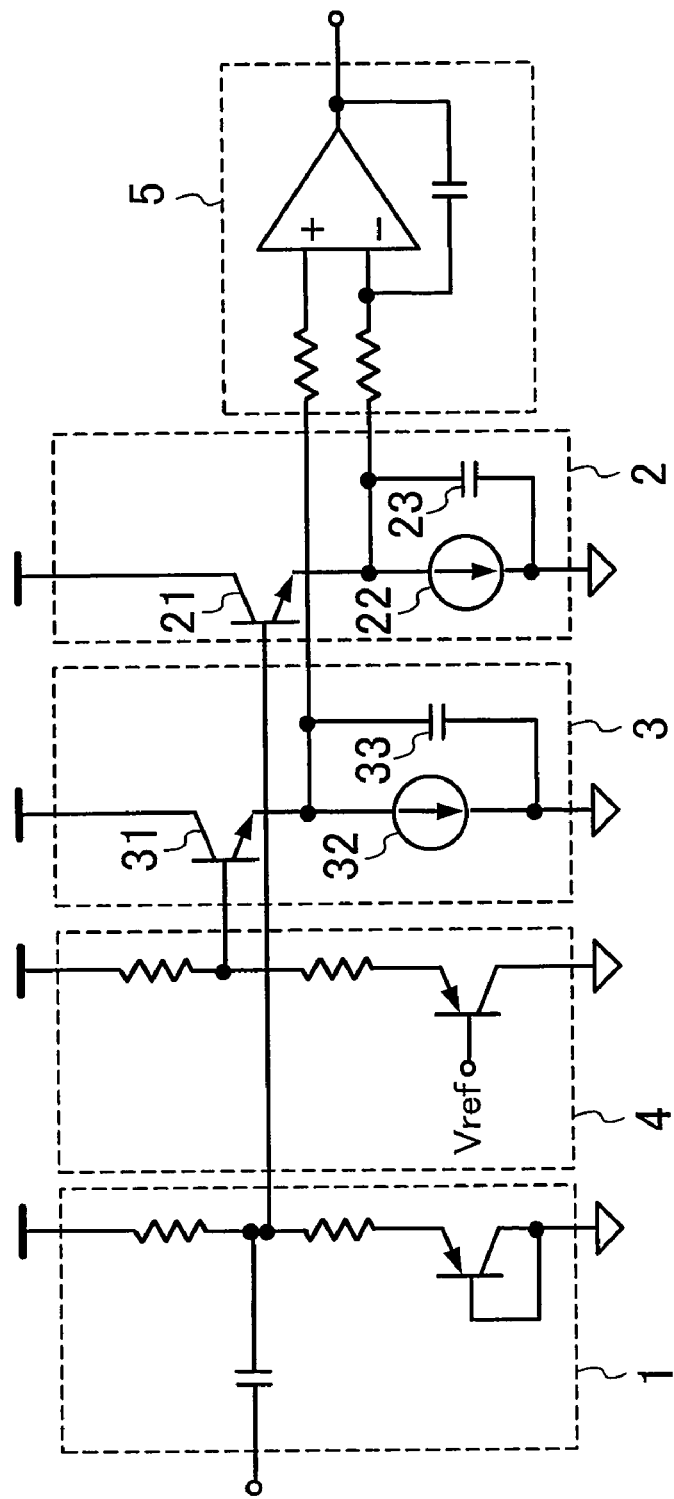
FIG. 5 shows the structure of a conventional high frequency power detector circuit.

The detector 40 detects the intermediate terminal voltage of the resistance row 110 of the envelope detector circuit 10 with reference to the source voltage of the transistor 201 of the envelope detector circuit 20, i.e., a total voltage of the resistance row 210. More specifically, the detector 40 may be a comparator. In this case, the detector 40 compares the intermediate terminal voltage with the source voltage of the transistor 201 of the envelope detector circuit 20, i.e., the total voltage of the resistance row 210. From the comparison results, the power level of the input high frequency signal is obtained. The low-pass filter or an A/D converter shown in FIG. 5 may also be used as the detector 40.

According to the present embodiment, the envelope detector circuit is configured without using the current source and the reference voltage is generated by the replica of the envelope detector circuit without providing an independent reference voltage generating circuit. Therefore, as compared with the conventional ones, the high frequency power detector circuit is improved in resistance against variations in the course of manufacture, change in temperature and change in supply voltage, thereby raising precision of high frequency power detection, and is reduced in size.

The transistors 101 and 102 may consist of P-channel field effect transistors, respectively. In this case, the resistance rows 110 and 210 and the capacitative elements 120 and 220 are connected to the supply voltage. As the transistors 101 and 102, other kinds of transistors such as bipolar transistors may be used. Further, the resistance elements and the capacitative elements of the high frequency power detector circuit may be realized by transistors.

Each of the resistance rows 110 and 210 may include three or more resistance elements connected in series. In this case, an intermediate terminal voltage of the resistance row 210 may be input into the detector 40 in place of the source voltage of the transistor 201.

Embodiment 2

Figure 2:
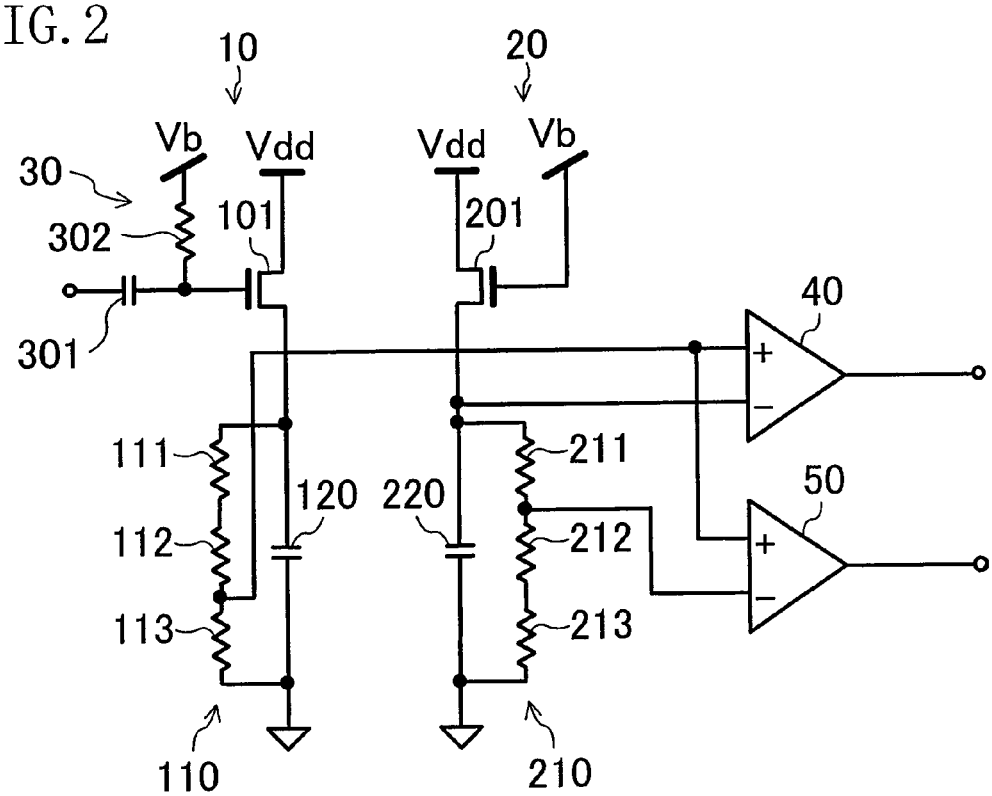
FIG. 2 shows the structure of a high frequency power detector circuit according to Embodiment 2 of the present invention.

FIG. 2 shows the structure of a high frequency power detector circuit according to Embodiment 2. In an automatic gain control system of a common receiver, a feed back control system performs hysteresis control to ensure stability. For this reason, an upper limit and a lower limit of the power level of a high frequency signal have to be detected. According to the high frequency power detector circuit of the present embodiment, the power level of an input high frequency signal can be detected based on two reference voltages. More specifically, the high frequency power detector circuit of the present embodiment is the same as the high frequency power detector circuit of Embodiment 1 except that a detector 50 is additionally provided. The difference from the structure of Embodiment 1 is described below in detail.

In an envelope detector circuit 10, a resistance row 110 includes three resistance elements 111, 112 and 113 connected in series. Among intermediate terminal voltages of the resistance row 110, the envelope detector circuit 10 outputs the one which is the nearest to a ground node, i.e., a voltage at a connection point between the resistance elements 112 and 113. In an envelope detector circuit 20, a resistance row 210 includes three resistance elements 211, 212 and 213 connected in series. The envelope detector circuit 20 outputs a total voltage of the resistance row 210 (a source voltage of the transistor 201) as a first reference voltage and outputs a voltage at a connection point between the resistance elements 211 and 212 as a second reference voltage. The detector 40 detects the output of the envelope detector circuit 10 with respect to the first reference voltage. The detector 50 detects the output of the envelope detector circuit 10 with respect to the second reference voltage. The detector 50 may be a comparator, a low-pass filter or an A/D converter. Setting the resistance ratio among the resistance elements 211, 212 and 213 of the resistance row 210 to a suitable value makes it possible to control the first and second reference voltages to values corresponding to the upper limit and the lower limit of the power level of the high frequency signal, respectively.

According to the present embodiment, the upper limit and the lower limit of the power level of the input high frequency signal are detected. Therefore, a feedback loop of an automatic gain control system is controlled with stability.

It is needless to say that the power level of the high frequency signal is detected with higher precision by increasing the number of detectors and reference voltages.

Embodiment 3

Figure 3:
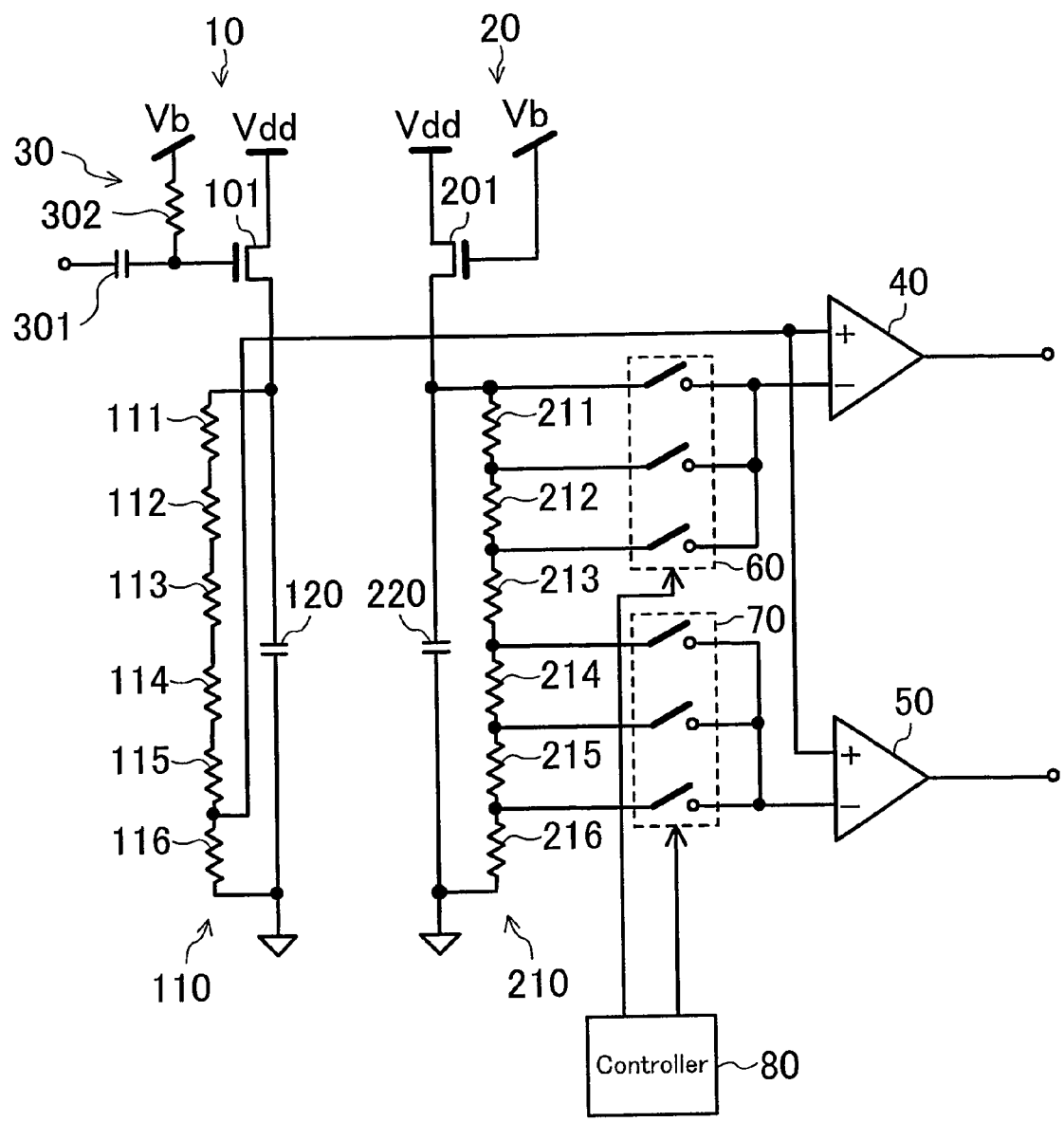
FIG. 3 shows the structure of a high frequency power detector circuit according to Embodiment 3 of the present invention.

FIG. 3 shows the structure of a high frequency power detector circuit according to Embodiment 3. The high frequency power detector circuit of the present embodiment is the same as the high frequency power detector circuit of Embodiment 2 except that selectors 60 and 70 for switching between the first and second reference voltages output from the envelope detector circuit 20 and a controller 80 are additionally provided. The difference from Embodiment 2 is described below in detail.

In an envelope detector circuit 10, a resistance row 110 includes six resistance elements 111, 112, 113, 114, 115 and 116 connected in series. Among intermediate terminal voltages of the resistance row 110, the envelope detector circuit 10 outputs the one which is the nearest to a ground node, i.e., a voltage at a connection point between the resistance elements 115 and 116. In an envelope detector circuit 20, a resistance row 210 includes six resistance elements 211, 212, 213, 214, 215 and 216 connected in series.

The selector 60 outputs any one of a total voltage of the resistance row 210 (a source voltage of the transistor 201), a voltage at a connection point between the resistance elements 211 and 212 and a voltage at a connection point between the resistance elements 212 and 213 as a first reference voltage. The selector 70 outputs any one of a voltage at a connection point between the resistance elements 213 and 214, a voltage at a connection point between the resistance elements 214 and 215 and a voltage at a connection point between the resistance elements 215 and 216 as a second reference voltage. The controller 80 controls the operations of the selectors 60 and 70.

According to the present embodiment described above, switching between the first and second reference voltages is available. Therefore, for example, a preferable reference voltage is selected based on variations in the course of manufacture, change in temperature, change in supply voltage and an operation mode of a reception system. For example, when the switching between the first and second reference voltages is performed in a time-sharing manner, six power levels at the maximum can be detected by the two detectors 40 and 50. One of the selectors 60 and 70 may be omitted so that one of the first and second reference voltages is set as a fixed value.

Embodiment of Radio Communication Device

Figure 4:
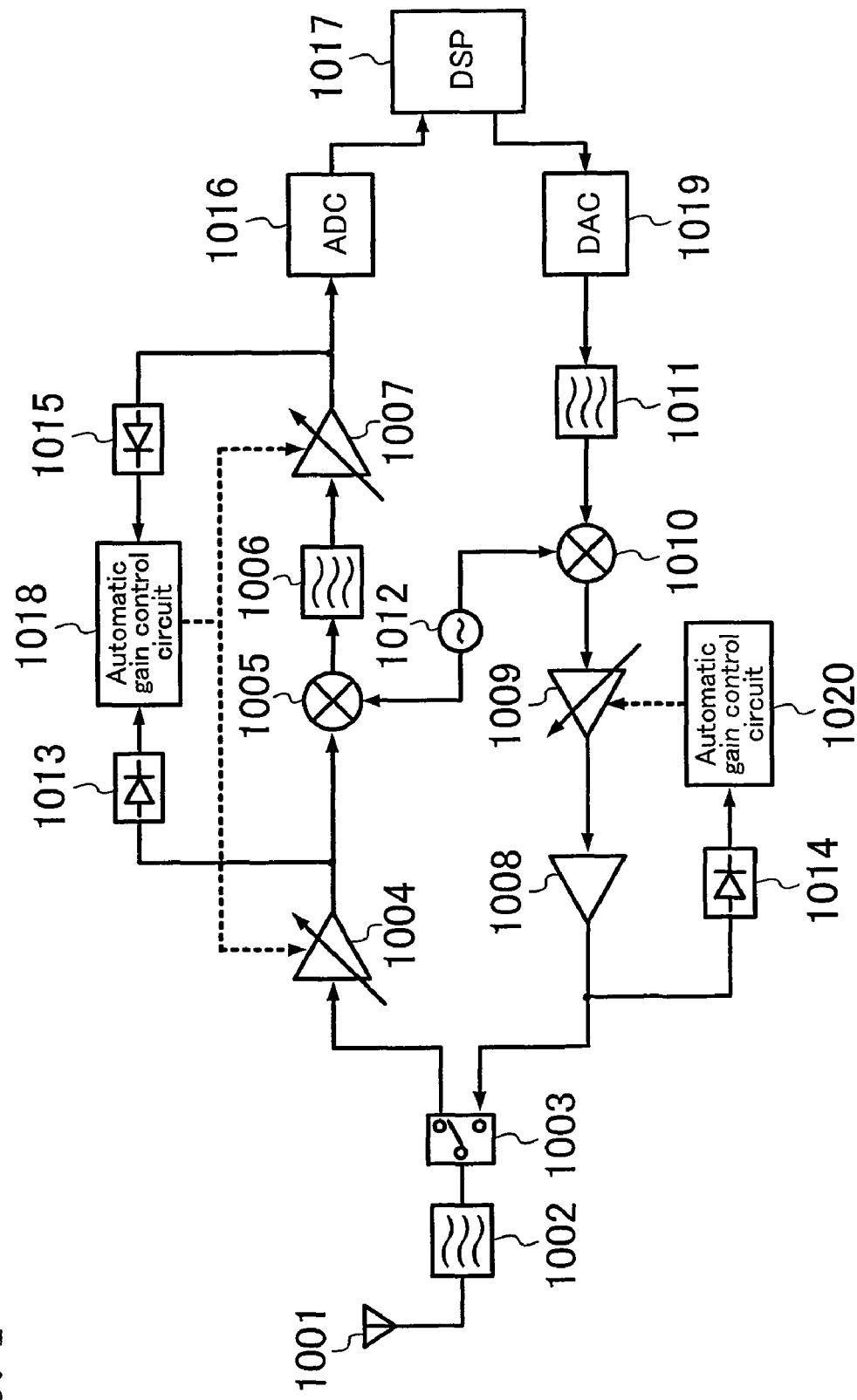
FIG. 4 shows the structure of a radio communication device according to an embodiment of the present invention.

FIG. 4 shows an embodiment of a radio communication device including a high frequency power detector circuit according to any one of Embodiments 1 to 3. In a receiving system of the radio communication device of the present embodiment, a high frequency signal received by an antenna 1001 is input to a variable gain low-noise amplifier 1004 through a high frequency filter 1002 and a transmit-receive switch 1003. The received signal amplified by the low-noise amplifier 1004 is supplied to a high frequency power detector circuit 1013 and a mixer 1005. The mixer 1005 mixes an output of the low-noise amplifier 1004 and a local signal output from a local signal generator 1012 to down-convert the received signal to a baseband frequency signal. An output of the mixer 1005 is supplied to a variable gain baseband amplifier 1007 through a baseband filter 1006. The received signal amplified by the baseband amplifier 1007 is then supplied to an A/D converter 1016 and a baseband power detector circuit 1015.

The A/D converter 1016 converts the received signal input thereto into a digital signal. A digital signal processor 1017 processes the digital output of the A/D converter 1016. The high frequency power detector circuit 1013 and the baseband power detector circuit 1015 detect the output power level of each of the low-noise amplifier 1004 and the baseband amplifier 1007. An automatic gain control circuit 1018 performs feedback control based on the detection results so that the values of the gains of the low-noise amplifier 1004 and the baseband amplifier 1007 become suitable for the output power levels. For example, when the power level of the input signal is increased from a minimum reception level, optimum control is performed to reduce the gain of the baseband amplifier 1007 and then reduce the gain of the low-noise amplifier 1004 so that the signal input to the A/D converter 1016 is not distorted. On the other hand, when the power level of the input signal is decreased from a maximum allowable level, optimum control is performed to increase the gain of the low-noise amplifier 1004 so that the received signal input to the A/D converter 1016 is not distorted and then increase the gain of the baseband amplifier 1007.

In a transmission system of the radio communication device of the present embodiment, a digital signal output from the digital signal processor 1017 is converted into an analog signal by a D/A converter 1019. The analog signal is supplied to a mixer 1010 through a baseband filter 1011. The mixer 1010 mixes the output signal of the baseband filter 1011 and a local signal output from the local signal generator 1012 to up-convert the transmission signal to a high frequency signal. The high frequency transmission signal is amplified by a variable gain driver amplifier 1009 and a power amplifier 1008 to a desired power level and supplied to a high frequency power detector circuit 1014 and the transmit-receive switch 1003. The high frequency transmission signal is then transmitted from the antenna 1001 through the transmit-receive switch 1003 and the high frequency filter 1002. The high frequency power detector circuit 1014 detects the output power level of the power amplifier 1008. An automatic gain control circuit 1020 performs feedback control based on the detection results so that the value of the gain of the power amplifier 1008 becomes suitable for the output power level.

A single high frequency power detector circuit may be used as the high frequency power detector circuits 1013 and 1014. Further, the receiving system and the transmission system of the radio communication device described above may be configured independently to provide a radio signal receiver and a radio signal transmitter.

As described above, the high frequency power detector circuit of the present invention is able to detect the power level of a high frequency signal with precision and is reduced in size. Therefore, it is useful for mobile radio communication terminals such as cellular phones. By incorporating the thus-configured high frequency power detector circuit in the radio communication device, a transmission/reception system is provided with improved communication quality.

What is claimed is:

1. A high frequency power detector circuit for detecting a power level of an input high frequency signal comprising:
    first and second envelope detector circuits each having a resistance row, a capacitative element connected to the resistance row in parallel and a transistor connected between a connection point between the resistance row and the capacitative element and a predetermined voltage node;
    a level shifter for shifting a center level of the high frequency signal to a predetermined voltage; and
    a detector for detecting an intermediate terminal voltage of the resistance row of the first envelope detector circuit with reference to a total voltage or an intermediate terminal voltage of the resistance row of the second envelope detector circuit; wherein
    an output of the level shifter is supplied to a gate or a base of the transistor of the first envelope detector circuit and the predetermined voltage is supplied to a gate or a base of the transistor of the second envelope detector circuit.

2. The high frequency power detector circuit of claim 1, further comprising:
    a selector for selecting any one of the total voltage and one or more intermediate terminal voltages of the resistance row of the second envelope detector circuit as an input to the detector.

3. The high frequency power detector circuit of claim 2, further comprising:
    a controller for controlling the operation of the selector.

4. The high frequency power detector circuit of claim 1, further comprising:
    a second detector for detecting the intermediate terminal voltage input from the first envelope detector circuit to said detector with reference to an intermediate terminal voltage of the resistance row of the second envelope detector circuit, the intermediate terminal voltage being different from the intermediate terminal voltage input to said detector.

5. The high frequency power detector circuit of claim 4, further comprising:
a selector for selecting any one of multiple intermediate terminal voltages of the resistance row of the second envelope detector circuit as an input to the second detector.

6. The high frequency power detector circuit of claim 5, further comprising:
a controller for controlling the operation of the selector.

7. A radio communication device comprising the high frequency power detector circuit of claim 1.

8. A radio communication device comprising the high frequency power detector circuit of claim 2.

9. A radio communication device comprising the high frequency power detector circuit of claim 3.

10. A radio communication device comprising the high frequency power detector circuit of claim 4.

11. A radio communication device comprising the high frequency power detector circuit of claim 5.

12. A radio communication device comprising the high frequency power detector circuit of claim 6.

* * * * *